(12) United States Patent
Kawamura et al.

(10) Patent No.: US 11,688,548 B2
(45) Date of Patent: Jun. 27, 2023

(54) POWER CONVERSION DEVICE

(71) Applicant: Mitsubishi Electric Corporation, Tokyo (JP)

(72) Inventors: Mao Kawamura, Tokyo (JP); Hayato Tanabe, Tokyo (JP); Takuya Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 153 days.

(21) Appl. No.: 17/387,256

(22) Filed: Jul. 28, 2021

(65) Prior Publication Data

US 2022/0199317 A1 Jun. 23, 2022

(30) Foreign Application Priority Data

Dec. 18, 2020 (JP) ................................ 2020-209838

(51) Int. Cl.
| | |
|---|---|
| *H02M 7/537* | (2006.01) |
| *H01F 27/34* | (2006.01) |
| *H01F 27/24* | (2006.01) |
| *H01F 27/28* | (2006.01) |
| *H01F 27/08* | (2006.01) |
| *H02M 1/00* | (2006.01) |

(52) U.S. Cl.
CPC ........... *H01F 27/346* (2013.01); *H01F 27/08* (2013.01); *H01F 27/24* (2013.01); *H01F 27/28* (2013.01); *H02M 1/0009* (2021.05); *H02M 7/537* (2013.01)

(58) Field of Classification Search
CPC ........ H01F 27/346; H01F 27/08; H01F 27/28; H02M 1/0009; H02M 7/537
See application file for complete search history.

(56) References Cited

U.S. PATENT DOCUMENTS

| | | | |
|---|---|---|---|
| 9,537,423 B2 * | 1/2017 | Mao ..................... | H02M 7/797 |
| 2020/0180451 A1 * | 6/2020 | Kawamura ......... | H02M 3/1584 |

FOREIGN PATENT DOCUMENTS

| | | |
|---|---|---|
| EP | 3 425 783 A1 | 1/2019 |
| WO | 2017/149776 A1 | 9/2017 |

* cited by examiner

*Primary Examiner* — Adolf D Berhane
(74) *Attorney, Agent, or Firm* — Sughrue Mion, PLLC; Richard C. Turner

(57) ABSTRACT

The power conversion device includes: a boost, converter which includes a magnetically-coupled reactor and a plurality of semiconductor switching elements connected to the magnetically-coupled reactor; an inverter; a cooler for cooling the magnetically-coupled reactor; a bus bar which is a conductive wiring member; and a current sensor for detecting a magnetic flux generated around the bus bar. The magnetically-coupled reactor includes a first winding, a second winding, and a core for magnetically coupling the first winding and the second winding. The core has a composite magnetic body containing soft magnetic powder and a binder, and at least parts of the first winding and the second winding are embedded in the composite magnetic body. The cooler is provided in contact with the magnetically-coupled reactor. The current sensor is provided on a side opposite to the magnetically-coupled reactor with the cooler therebetween.

7 Claims, 14 Drawing Sheets

POWER CONVERSION DEVICE

BACKGROUND OF THE INVENTION

1. Field of the Invention

The present disclosure relates to a power conversion device.

2. Description of the Background Art

In recent years, as environmentally friendly vehicles, electric vehicles (EV) or hybrid vehicles such as a hybrid electric vehicle (HEV) and a plug-in hybrid electric vehicle (PHEV) have been developed. In a vehicle with an electric motor used as a drive source, as in an electric vehicle or a hybrid vehicle, a power conversion device having a large power capacity is mounted. The power conversion device is a device for converting input current from DC to AC or from AC to DC or for converting input voltage to different voltage. The electric vehicle or the hybrid vehicle is provided with an auxiliary battery for operating a control circuit, which is also provided in a conventional vehicle, and in addition, a drive battery for driving a traveling electric motor with charged power.

In addition, the power conversion device is often provided with a bus bar and a current sensor for detecting the amount of current flowing through the bus bar. The bus bar is a conductive member formed from a metal plate or a metal bar and used in a current path where the current amount is large. The current sensor detects a magnetic flux (hereinafter, a magnetic flux of the bus bar) generated from current flowing through the bus bar, by a magnetic detection element (hereinafter, current sensor element). A signal value corresponding to a magnetic flux amount outputted from the current sensor element is multiplied by a predetermined coefficient, whereby a current value is obtained. The current sensor has a magnetic collection core surrounding the bus bar along the circumferential direction, and detects a collected magnetic flux of the bus bar by the current sensor element. Meanwhile, with improvement in sensitivity of the current sensor element and the like, a current sensor configured without provision of a magnetic collection core is also proposed. In such a current sensor configuration not having a magnetic collection core, the number of components can be decreased and an expensive magnetic collection core formed from an electromagnetic steel or the like is not needed, so that the cost can be reduced.

In a vehicle provided with a power conversion device, along with advancement of power electronics technology, electric powertrain components as well as the power conversion device are desired to be reduced in loss and size so as to improve fuel efficiency. As technology for reducing the loss and the size of the power conversion device, a converter circuit using a multiphase converter reactor is disclosed (see, for example, Patent Document 1). The multiphase converter reactor is a magnetically-coupled reactor formed by magnetically coupling two cores with each other and providing coils for multiple phases to the integrated core.

Patent Document 1: WO2017/149776

In Patent Document 1, the magnetically-coupled reactor formed by providing coils for multiple phases to the integrated core is used for the converter circuit, whereby a power conversion device including the converter circuit can be downsized. However, magnetic fluxes generated from the plurality of coils flow in such directions as to collide with each other, so that the magnetic fluxes leak to the outside from the core. Thus, there is a problem of causing a leakage magnetic flux. Such a leakage magnetic flux other than the magnetic flux of the bus bar which is a measurement target influences a detected value of current obtained from the current sensor element. In particular, a current sensor not having a magnetic collection core is likely to detect a magnetic flux of the leakage magnetic flux. Therefore, in a power conversion device in which a leakage magnetic flux is likely to occur, the current sensor not having a magnetic collection core cannot accurately detect the magnetic flux of the bus bar.

In such a conventional power conversion device using a magnetically-coupled reactor and a current sensor, as a measure against deterioration in detection accuracy of the current sensor due to the influence of the leakage magnetic flux, a magnetic shield is provided to suppress the influence of the leakage magnetic flux on the current sensor. However, since the magnetic shield is newly provided, the number of components of the power conversion device increases, thus causing a problem of increasing the size of the power conversion device.

SUMMARY OF THE INVENTION

Accordingly, an object of the present disclosure is to obtain a power conversion device in which deterioration in accuracy of a current sensor due to a leakage magnetic flux is suppressed while size increase is suppressed.

A power conversion device according to the present disclosure includes: a boost converter which includes a magnetically-coupled reactor and a plurality of semiconductor switching elements connected to the magnetically-coupled reactor, and boosts DC voltage supplied from an external power supply; an inverter which converts DC power outputted from the boost converter, to AC power, and supplies the AC power to an external load; a cooler for cooling the magnetically-coupled reactor; a bus bar which is a conductive wiring member; and a current sensor for detecting a magnetic flux generated around the bus bar. The plurality of semiconductor switching elements include a first semiconductor switching element and a second semiconductor switching element connected in series between positive-side and negative-side output terminals of the boost converter, and a third semiconductor switching element and a fourth semiconductor switching element connected in series between the positive-side and negative-side output terminals. The magnetically-coupled reactor includes: a first winding having one end connected to a positive side of the external power supply and another end connected between the first semiconductor switching element and the second semiconductor switching element; a second winding having one end connected to the positive side of the external power supply and another end connected between the third semiconductor switching element and the fourth semiconductor switching element, the second winding being wound with the same number of turns as the first winding so as to be magnetically coupled with the first winding in a direction opposite thereto; and a core for magnetically coupling the first winding and the second winding. The core has a composite magnetic body containing soft magnetic powder and a binder, and at least parts of the first winding and the second winding are embedded in the composite magnetic body. The cooler is provided in contact with the magnetically-coupled reactor. The current sensor is provided on a side opposite to the magnetically-coupled reactor with the cooler therebetween.

In the power conversion device according to the present disclosure, the magnetically-coupled reactor includes the first winding, the second winding, and the core magnetically coupling the first winding and the second winding and having the composite magnetic body containing the soft magnetic powder and the binder. At least parts of the first winding and the second winding are embedded in the composite magnetic body, and the current sensor is provided on the side opposite to the magnetically-coupled reactor with the cooler provided therebetween in contact with the magnetically-coupled reactor. Thus, the current sensor is provided so as to be distant from the magnetically-coupled reactor. Therefore, even if a leakage magnetic flux is generated from the magnetically-coupled reactor, deterioration in accuracy of the current sensor due to the leakage magnetic flux can be suppressed. In addition, most part of a magnetic flux generated from the magnetically-coupled reactor passes inside the core provided on the outer side of the windings. Therefore, the leakage magnetic flux generated from the magnetically-coupled reactor is inhibited from entering each current sensor, and deterioration in accuracy of each current sensor due to the leakage magnetic flux can be suppressed. In addition, without providing an additional component such as a magnetic shield, deterioration in accuracy of each current sensor due to the leakage magnetic flux can be suppressed. Thus, size increase of the power conversion device can be suppressed.

DETAILED DESCRIPTION OF THE PREFERRED EMBODIMENTS OF THE INVENTION

Figure 1:
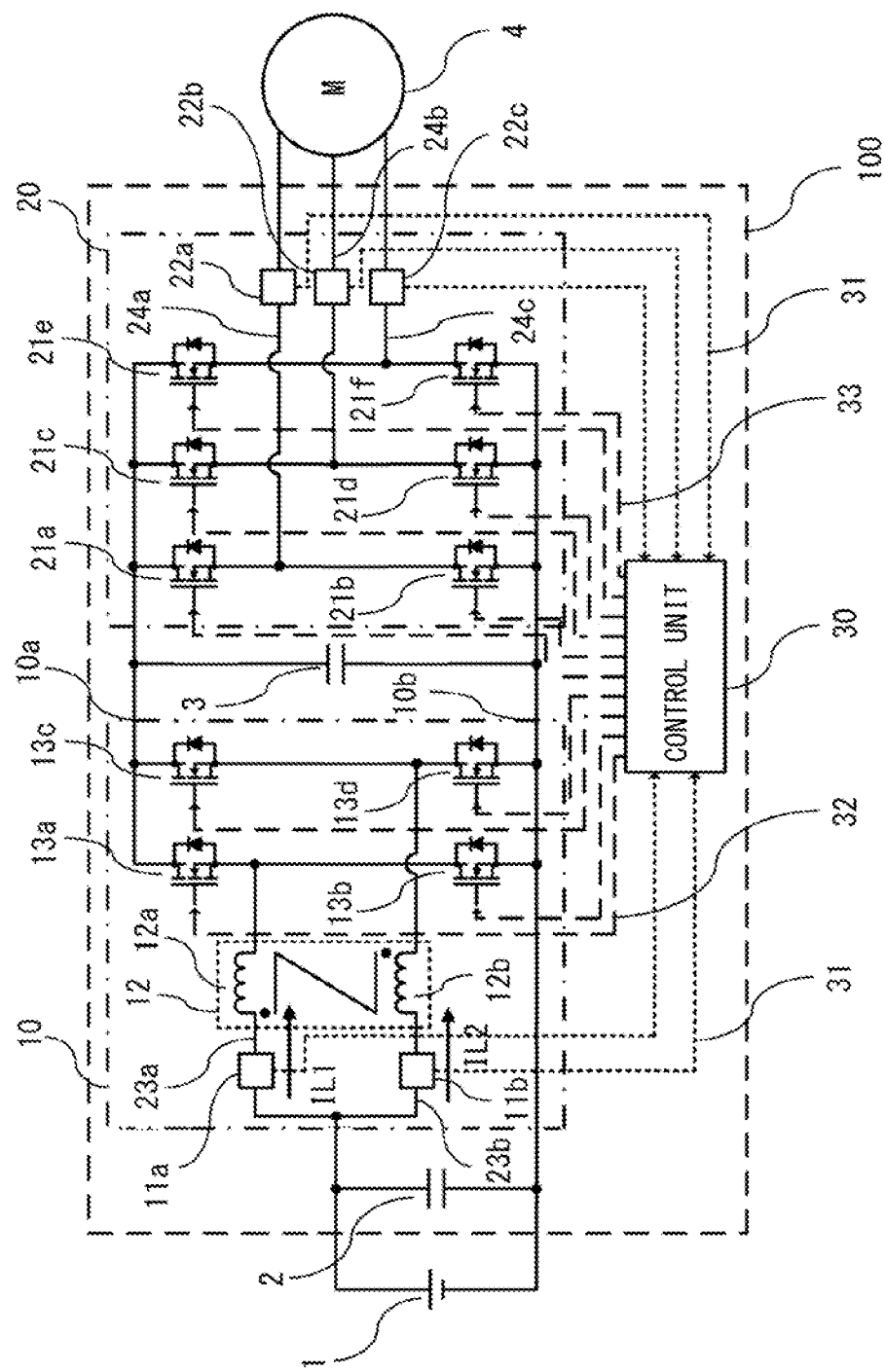
FIG. 1 is a configuration diagram schematically showing a power conversion device according to the first embodiment of the present disclosure.

Hereinafter, a power conversion device according to embodiments of the present disclosure will be described with reference to the drawings. In the drawings, the same or corresponding members or parts are denoted by the same reference characters, to give description.

First Embodiment

Figure 2:
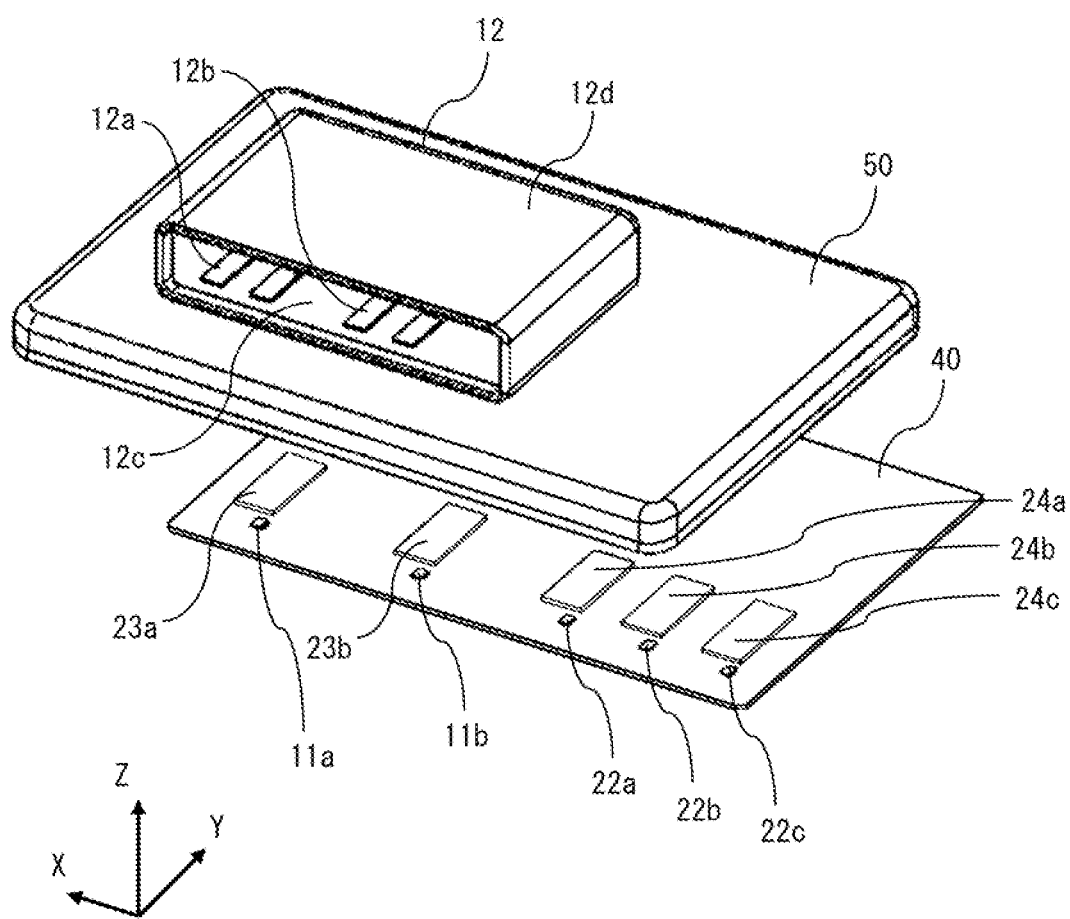
FIG. 2 is a perspective view showing a specific part of the power conversion device according to the first embodiment.
Figure 3:
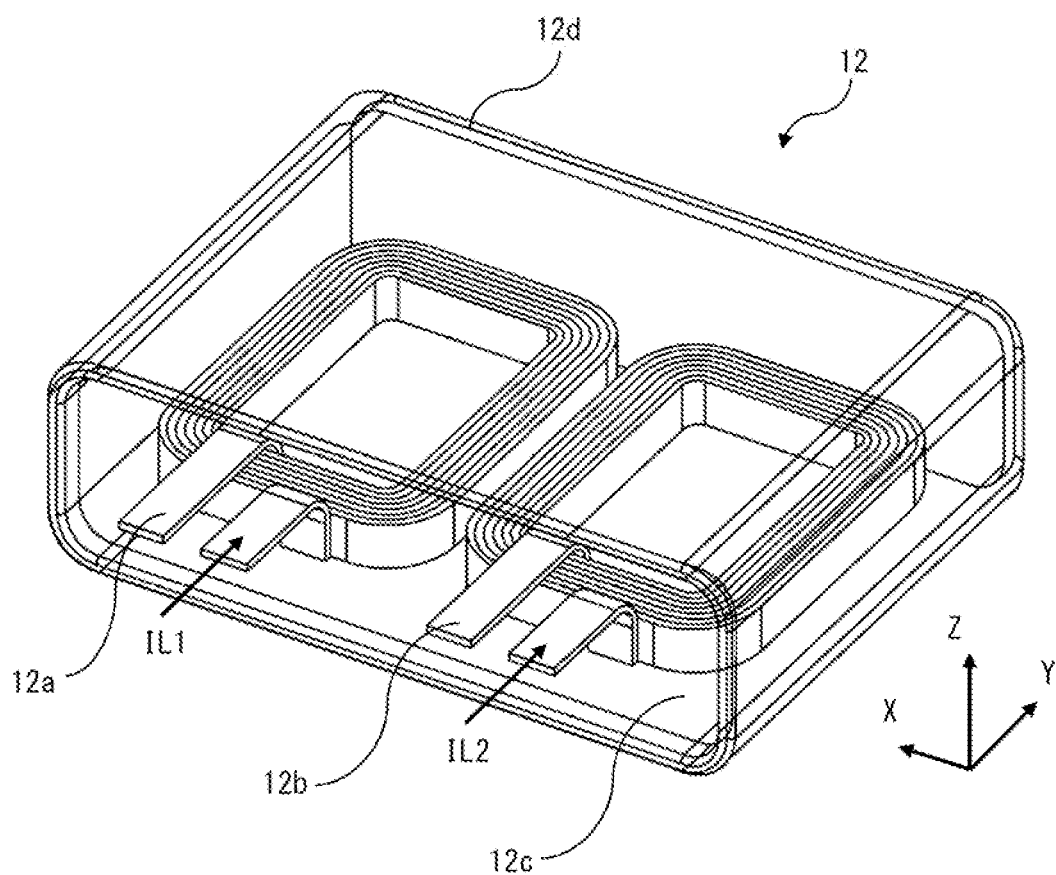
FIG. 3 is a perspective view showing a magnetically-coupled reactor of the power conversion device according to the first embodiment.
Figure 4:
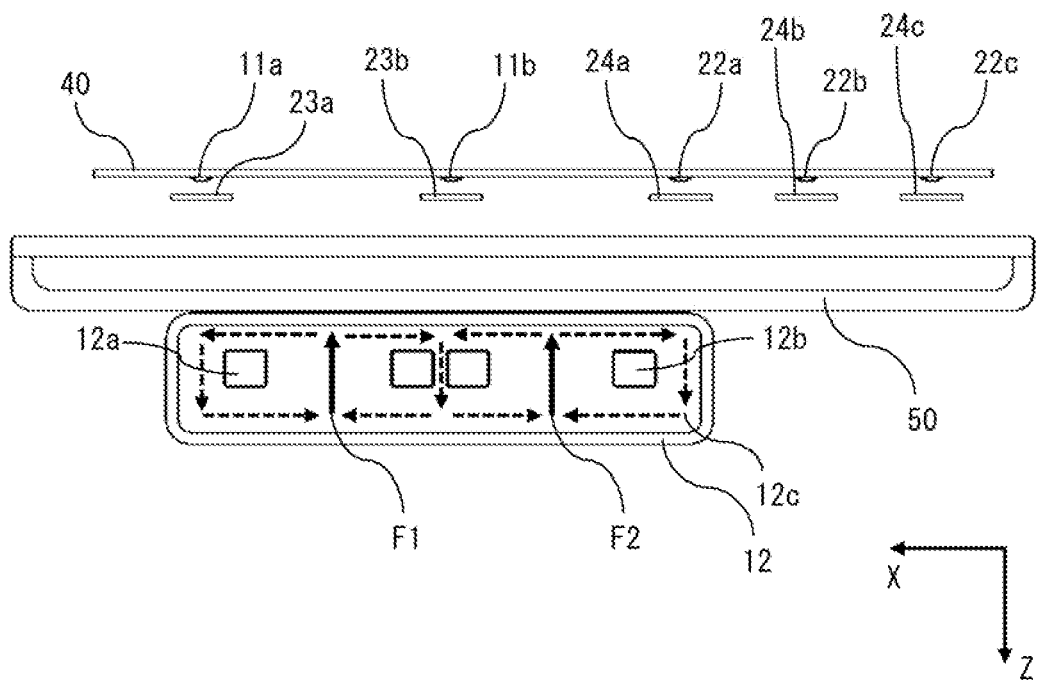
FIG. 4 is a sectional view showing a specific part of the power conversion device according to the first embodiment.
Figure 5:
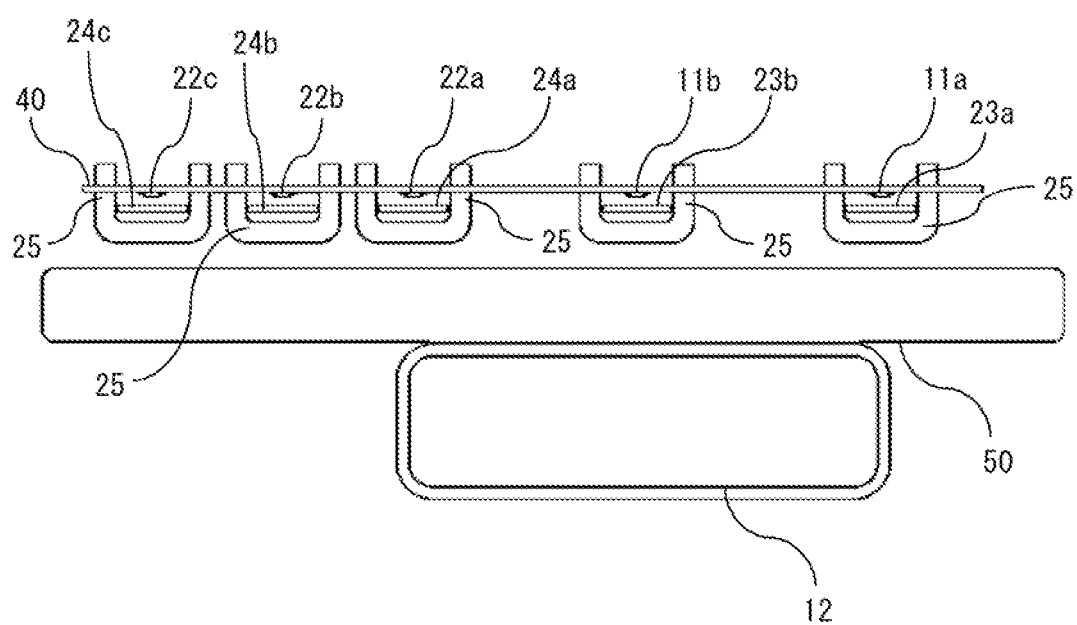
FIG. 5 is a sectional view showing a specific part of another power conversion device according to the first embodiment.
Figure 6:
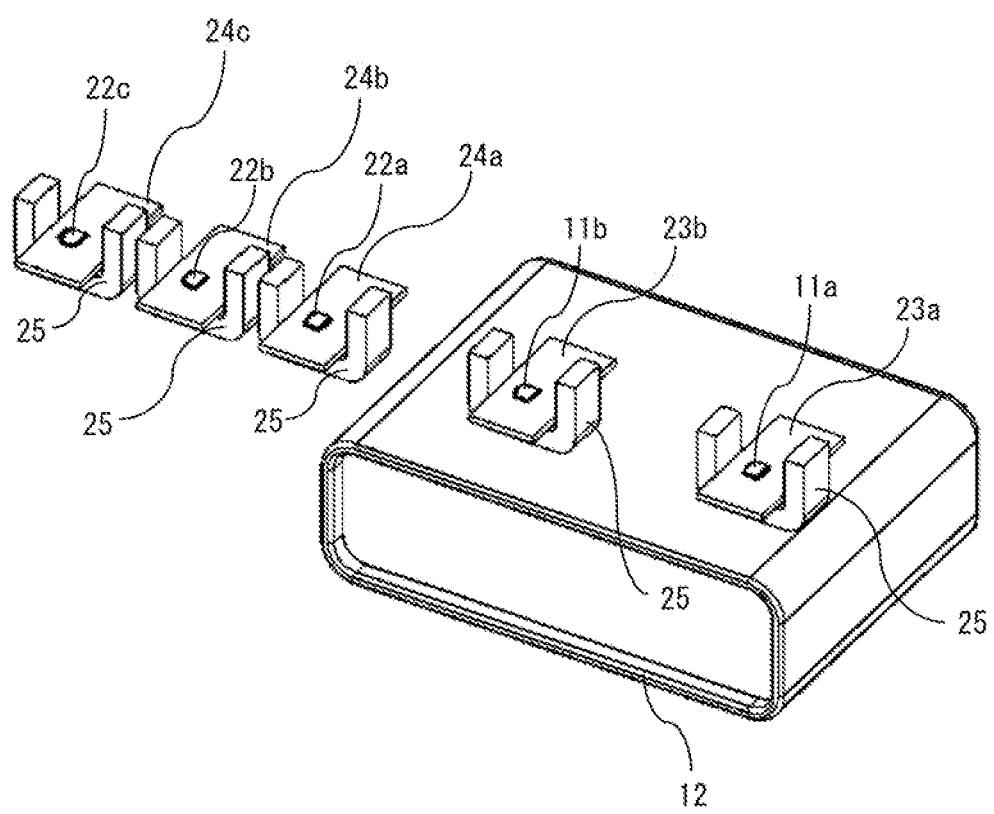
FIG. 6 is a perspective view showing a specific part of the other power conversion device according to the first embodiment.
Figure 13:
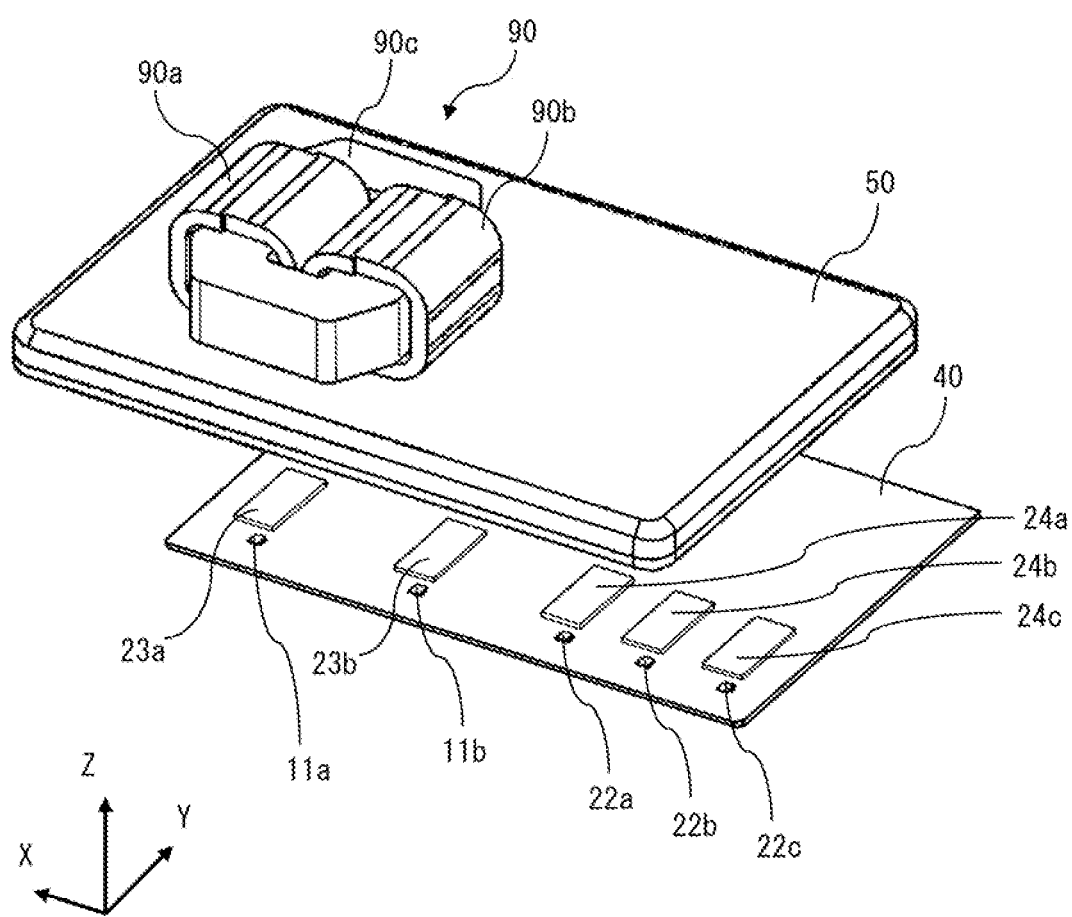
FIG. 13 is a perspective view showing a specific part of a power conversion device in a comparative example.
Figure 14:
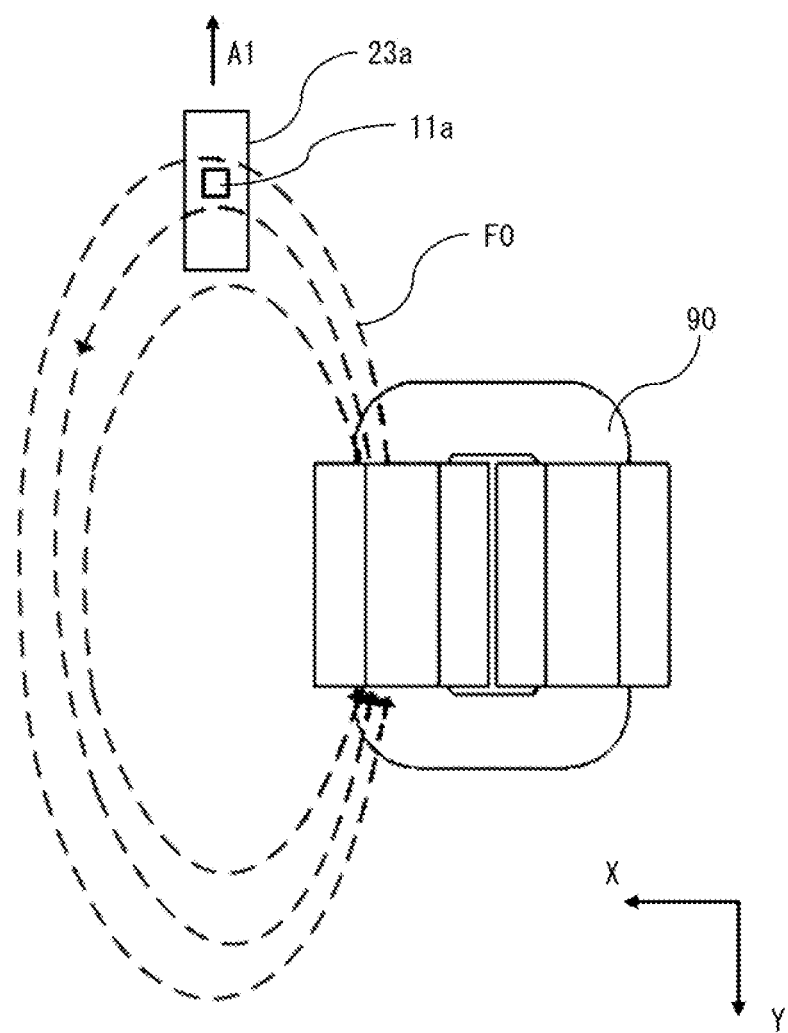
FIG. 14 illustrates a magnetic flux generated at a magnetically-coupled reactor of the power conversion device in the comparative example.

FIG. 1 is a configuration diagram schematically showing a power conversion device 100 according to the first embodiment of the present disclosure, FIG. 2 is a perspective view showing a specific part of the power conversion device 100, FIG. 3 is a perspective view showing a magnetically-coupled reactor 12 of the power conversion device 100, FIG. 4 is a sectional view showing a specific part of the power conversion device 100, FIG. 5 is a sectional view showing a specific part of another power conversion device 100 according to the first embodiment, FIG. 6 is a perspective view showing a specific part of the other power conversion device 100 according to the first embodiment, FIG. 13 is a perspective view showing a specific part of a power conversion device in a comparative example, and FIG. 14 illustrates a magnetic flux generated at a magnetically-coupled reactor of the power conversion device in the comparative example. The power conversion device 100 boosts DC voltage of a DC input power supply 1, performs conversion from DC to AC, and supplies the resultant power to a motor 4 which is an external load. The motor 4 is driven by the supplied AC power.

<Power Conversion Device 100>

As shown in FIG. 1, the power conversion device 100 includes: a DC-DC boost converter circuit 10 which is a boost converter for boosting DC voltage supplied from the DC input power supply 1 which is an external power supply; and an inverter circuit 20 which is an inverter for converting DC power outputted from the DC-DC boost converter circuit 10, to AC power, and supplying the AC power to the motor 4. The DC input power supply 1 and the DC-DC boost converter circuit 10 are connected via an input power smoothing capacitor 2. The DC-DC boost converter circuit 10 and the inverter circuit 20 are connected via a link capacitor 3. The power conversion device 100 includes: a control unit 30 which is a control circuit for controlling the DC-DC boost converter circuit 10 and the inverter circuit 20; and a cooler 50 (not shown in FIG. 1) for cooling the magnetically-coupled reactor 12 provided in the DC-DC boost converter circuit 10.

The DC-DC boost converter circuit 10 includes the magnetically-coupled reactor 12, and a plurality of semiconductor switching elements connected to the magnetically-coupled reactor 12. The DC-DC boost converter circuit 10 includes: bus bars 23a, 23b which are conductive wiring members and connect the magnetically-coupled reactor 12 and the DC input power supply 1; and current sensors 11a, 11b which detect magnetic fluxes generated around the bus bars 23a, 23b. The plurality of semiconductor switching elements are constituted of a first semiconductor switching element 13a and a second semiconductor switching element 13b connected in series between a positive-side output terminal 10a and a negative-side output terminal 10b of the DC-DC boost converter circuit 10, and a third semiconductor switching element 13c and a fourth semiconductor switching element 13d connected in series between the positive-side output terminal 10a and the negative-side output terminal 10b. The positive-side output terminal 10a is connected to a positive terminal of the link capacitor 3, and the negative-side output terminal 10b is connected to a negative terminal of the link capacitor 3.

The magnetically-coupled reactor 12 includes a first winding 12a, a second winding 12b, and a core 12c (not shown in FIG. 1). The first winding 12a has one end connected to the positive side of the DC input power supply 1 via the bus bar 23a, and another end connected between the first semiconductor switching element 13a and the second semiconductor switching element 13b. The second winding 12b has one end connected to the positive side of the DC input power supply 1 via the bus bar 23b, and another end connected between the third semiconductor switching element 13c and the fourth semiconductor switching element 13d. The second winding 12b is wound with the same number of turns as the first winding 12a, so as to be magnetically coupled with the first winding 12a in the direction opposite thereto. The DC input power supply 1 sides of the bus bars 23a, 23b are connected at one part, and the connected part is connected to the input power smoothing capacitor 2. The current sensors 11a, 11b detect magnetic fluxes generated around the bus bars 23a, 23b, respectively, thereby detecting currents flowing through the first winding 12a and the second winding 12b, respectively.

The inverter circuit 20 includes: a plurality of semiconductor switching elements; bus bars 24a, 24b, 24c which are conductive wiring members and connect the inverter circuit 20 and the motor 4; and current sensors 22a, 22b, 22c which detect magnetic fluxes generated around the bus bars 24a, 24b, 24c. The plurality of semiconductor switching elements are constituted of a first semiconductor switching element 21a and a second semiconductor switching element 21b connected in series between the positive terminal and the negative terminal of the link capacitor 3, a third semiconductor switching element 21c and a fourth semiconductor switching element 21d connected in the same manner, and a fifth semiconductor switching element 21e and a sixth semiconductor switching element 21f connected in the same manner. The connection points between the first semiconductor switching element 21a and the second semiconductor switching element 21b, between the third semiconductor switching element 21c and the fourth semiconductor switching element 21d, and between the fifth semiconductor switching element 21e and the sixth semiconductor switching element 21f, are respectively connected to the motor 4 via the bus bars 24a, 24b, 24c. Three-phase AC currents are outputted from the bus bars 24a, 24b, 24c. The current sensors 22a, 22b, 22c detect the three-phase AC output currents of the inverter circuit 20.

The detected values from the current sensors 11a, 11b and the current sensors 22a, 22b, 22c are sent to the control unit 30 via signal lines 31. The control unit 30 calculates current values from the detected values. In order that the current values become predetermined target values, the control unit 30 performs ON/OFF control for the plurality of semiconductor switching elements provided in the DC-DC boost converter circuit 10 and the plurality of semiconductor switching elements provided in the inverter circuit 20, via control lines 32, 33. It is noted that the circuit configurations of the DC-DC boost converter circuit 10 and the inverter circuit 20 are generally known and the operation principles thereof will not be described.

<Comparative Example of Arrangements of Magnetically-Coupled Reactor and Current Sensors>

A comparative example of arrangements of a magnetically-coupled reactor and current sensors will be described with reference to FIG. 13 and FIG. 14. As shown in FIG. 13, a magnetically-coupled reactor 90 in the comparative example is formed by winding a first winding 90a and a second winding 90b around the outer side of a core 90c. The cooler 50 is provided in contact with the magnetically-coupled reactor 90, and current sensors are provided on a side opposite to the magnetically-coupled reactor 90 with the cooler 50 therebetween. Bus bars are provided between the current sensors and the cooler 50. Only parts of the bus bars are shown. In the magnetically-coupled reactor 90, the windings are coupled such that their phases are opposite to each other. Therefore, when currents flow in the same direction, magnetic fluxes are generated in such directions as to cancel out each other in the core. As a result, the magnetically-coupled reactor 90 causes a disturbance magnetic field at an extremely high level on the outer side, as a leakage magnetic flux, and due to the influence of the disturbance magnetic field, detection accuracy of the current sensors is deteriorated.

FIG. 14 is a plan view as seen from the current sensor side of FIG. 13 in a state in which a control board 40 and the cooler 50 are removed, and only one of the bus bars and one of the current sensors are shown. In FIG. 14, broken arrow lines F0 indicate a leakage magnetic flux generated from the magnetically-coupled reactor 90, and an arrow A1 indicates the direction of current flowing through the bus bar 23a. It is noted that a leakage magnetic flux other than the arrow lines F0 is also generated from the magnetically-coupled reactor 90, but for simplification of the drawing, the other leakage magnetic flux is not shown here. The current sensor 11a is provided on the control board 40 (not shown in FIG. 14) such that a magnetic flux generated at the bus bar 23a and the magnetic sensing direction of the current sensor 11a coincide with each other. The magnetic flux of the bus bar is generated concentrically around the flowing current and perpendicularly to the direction of the current. Therefore, the X direction in FIG. 14 is the magnetic sensing direction of the current sensor 11a.

The leakage magnetic flux generated from the magnetically-coupled reactor 90 is formed as an elliptic uneven magnetic field, as shown by the arrow lines F0. In such an uneven magnetic field, the magnetic flux of the bus bar to be detected by the current sensor 11a is bent by the uneven magnetic field. The bent magnetic field is detected by the current sensor 11a. Thus, accuracy of the current sensor 11a is deteriorated due to the leakage magnetic flux. Although only the current sensor 11a is described here for the purpose of simplification, the other current sensors also have such a problem of accuracy deterioration. In addition, here, a DC magnetic flux generated due to a DC current component flowing through the magnetically-coupled reactor 90 is assumed. In a case of an AC magnetic flux, the leakage magnetic flux might be canceled out depending on members composing the cooler 50. However, a DC magnetic flux passes through the cooler 50 and reaches the current sensors.

<Arrangements of Magnetically-Coupled Reactor 12 and Current Sensors>

Arrangements of the magnetically-coupled reactor 12 and the current sensors will be described with reference to FIG. 2. The magnetically-coupled reactor 12 in the present embodiment is formed such that the first winding 12a, the second winding 12b, and the core 12c in which the first winding 12a and the second winding 12b are embedded, are housed in a case 12d. Each current sensor in FIG. 2 is a current sensor element such as a giant magneto resistive (GMR) element which performs magnetoelectric conversion, or a chip in which an amplification circuit or the like and a current sensor element are integrated. Here, a magnetic collection core is not provided around each bus bar, and only the current sensor is provided. In such cases where a current sensor element having high sensitivity is used for the current sensor or a magnetic collection structure is stored in the chip forming the current sensor, the current sensor can accurately detect current without providing a magnetic collection core. The current sensors are mounted on the control board 40 adjacently to the respective bus bars which are detection targets. Since a magnetic collection core is not provided, the power conversion device 100 can be downsized.

The cooler 50 is provided in contact with the magnetically-coupled reactor 12, and each current sensor is provided on the side opposite to the magnetically-coupled reactor 12 with the cooler 50 therebetween. The bus bars are provided between the current sensors and the cooler 50. In FIG. 2, only parts of the bus bars are shown, and the bus bars are provided so as to extend in the Y direction. In the present embodiment, the bus bars 23a, 23b are provided adjacently to the magnetically-coupled reactor 12 with the cooler 50 therebetween. The bus bars 24a, 24b, 24c are provided at positions adjacent to the second winding 12b of the magnetically-coupled reactor 12. A housing of the cooler 50 is made from aluminum, for example.

With the above arrangement structure, the cooler 50 can efficiently cool the magnetically-coupled reactor 12. Each current sensor is provided so as to be distant from the magnetically-coupled reactor 12. Therefore, even when a leakage magnetic flux is generated from the magnetically-coupled reactor 12, deterioration in accuracy of each current sensor due to the leakage magnetic flux can be suppressed. Since the bus bars are provided between the current sensors and the cooler 50, the distance between each current sensor and the magnetically-coupled reactor 12 can be further increased.

<Configuration of Magnetically-Coupled Reactor 12>

The details of the configuration of the magnetically-coupled reactor 12 will be described. As shown in FIG. 3, the magnetically-coupled reactor 12 has the first winding 12a, the second winding 12b, and the core 12c for magnetically coupling the first winding 12a and the second winding 12b. In FIG. 3, the inside of the magnetically-coupled reactor 12 is shown transparently. The core 12c has a composite magnetic body containing soft magnetic powder and a binder, and the first winding 12a and the second winding 12b are embedded in the composite magnetic body. The first winding 12a, the second winding 12b, and the core 12c are housed in the case 12d. The case 12d is made from a nonmagnetic material such as aluminum. The case 12d is formed in a rectangular parallelepiped shape having one opening surface, for example, and in FIG. 3, the opening surface of the case 12d is located on the −Y direction side. Ends of the first winding 12a and the second winding 12b are exposed from the opening surface of the case 12d.

The first winding 12a and the second winding 12b in the present embodiment are formed by rectangular wires, and are wound such that magnetic fluxes are generated in the Z direction when currents flow through the first winding 12a and the second winding 12b. The entireties of the first winding 12a and the second winding 12b are embedded in the core 12c, and only ends of the rectangular wires forming the first winding 12a and the second winding 12b protrude from a side surface portion of the core 12c. Without limitation to the configuration in which the entireties of the first winding 12a and the second winding 12b are embedded, at least parts of the first winding 12a and the second winding 12b may be embedded in the core 12c. In addition, the core 12c is a cast core formed by curing a slurry containing soft magnetic alloy powder, a binder, and the like.

Flow of a magnetic flux generated in the magnetically-coupled reactor 12 will be described with reference to FIG. 4. As shown in FIG. 1 and FIG. 3, currents IL1, IL2 flow through the first winding 12a and the second winding 12b of the magnetically-coupled reactor 12. First, magnetic fluxes indicated by solid-line arrows F1, F2 are generated, and then branched into broken-line arrows F1, F2. Most parts of the generated magnetic fluxes flow through routes passing inside the core 12c on the outer side of the windings as shown by a plurality of arrows F1, F2 in FIG. 4. Thus, even if the magnetically-coupled reactor 12 is used as a reactor, the magnetic flux generated from the magnetically-coupled reactor 12 is inhibited from entering the current sensors, whereby deterioration in accuracy of the current sensors can be suppressed.

In the present embodiment, the current sensor not having a magnetic collection core around each bus bar is used. However, the configuration of the current sensor is not limited thereto. As shown in FIG. 5 and FIG. 6, each bus bar may have a magnetic collection core 25 for collecting a magnetic flux generated around the bus bar. In FIG. 5, only the outer shapes of the magnetically-coupled reactor 12 and the cooler 50 are shown, and in FIG. 6, the control board 40 and the cooler 50 are removed. The magnetic collection core 25 surrounds the periphery of each bus bar, and each current sensor is provided at an opening part of the magnetic collection core 25. Each current sensor detects the magnetic flux collected by the magnetic collection core 25. Since each current sensor is provided at the opening part of the magnetic collection core 25 so as to be surrounded by the magnetic collection core 25, such a structure that the leakage magnetic flux hardly enters each current sensor is formed, whereby deterioration in accuracy of the current sensors can be further suppressed. In addition, the magnetic collection core 25 is provided on the side of the cooler 50 and the magnetically-coupled reactor 12 as seen from each current sensor. Thus, the leakage magnetic flux generated from the magnetically-coupled reactor 12 is further inhibited from entering each current sensor, whereby deterioration in accuracy of the current sensors can be further suppressed.

The power conversion device 100 according to the first embodiment is configured by a combination of a boost converter and an inverter. However, the configuration of the power conversion device 100 is not limited thereto. For example, the power conversion device 100 may be configured by a combination of a boost converter and two inverters.

As described above, in the power conversion device 100 according to the first embodiment, the magnetically-coupled reactor 12 has the first winding 12a, the second winding 12b, and the core 12c magnetically coupling the first winding 12a and the second winding 12b and having a composite magnetic body containing soft magnetic powder and a binder. At least parts of the first winding 12a and the second winding 12b are embedded in the composite magnetic body, and the current sensors are provided on the side opposite to the magnetically-coupled reactor 12 with the cooler 50 provided therebetween in contact with the magnetically-coupled reactor 12. Thus, the current sensors are provided so as to be distant from the magnetically-coupled reactor 12, whereby, even when a leakage magnetic flux is generated from the magnetically-coupled reactor 12, deterioration in accuracy of the current sensors due to the leakage magnetic flux can be suppressed. In addition, most part of the magnetic flux generated from the magnetically-coupled reactor 12 passes inside the core 12c provided on the outer side of the windings. Thus, the leakage magnetic flux generated from the magnetically-coupled reactor 12 is inhibited from entering the current sensors, whereby deterioration in accuracy of the current sensors due to the leakage magnetic flux can be suppressed. In addition, without providing an additional component such as a magnetic shield, deterioration in accuracy of the current sensors due to the leakage magnetic flux can be suppressed. Thus, size increase of the power conversion device 100 having the magnetically-coupled reactor 12 can be suppressed. In addition, the number of components can be decreased, whereby the cost for the power conversion device 100 can be reduced.

The power conversion device 100 includes the DC-DC boost converter circuit 10 having the magnetically-coupled reactor 12 and the plurality of semiconductor switching elements, and the inverter circuit 20. The magnetically-coupled reactor 12 includes: the first winding 12a having one end connected to the positive side of the external power supply and another end connected between the first semiconductor switching element 13a and the second semiconductor switching element 13b; the second winding 12b having one end connected to the positive side of the external power supply and another end connected between the third semiconductor switching element 13c and the fourth semiconductor switching element 13d, the second winding 12b being wound with the same number of turns as the first winding 12a so as to be magnetically coupled with the first winding 12a in the direction opposite thereto; and the core 12c. Thus, it is possible to suppress deterioration in accuracy of the current sensors due to a leakage magnetic flux while suppressing size increase of the power conversion device 100 having the boost converter and the inverter.

In a case where the bus bars are provided between the current sensors and the cooler 50, the distance between each current sensor and the magnetically-coupled reactor 12 can be further increased, whereby deterioration in accuracy of the current sensors due to the leakage magnetic flux can be further suppressed. In a case where each bus bar has the magnetic collection core 25 for collecting a magnetic flux generated around the bus bar and the current sensor detects the magnetic flux collected by the magnetic collection core 25, the current sensor is provided at the opening part of the magnetic collection core 25 so as to be surrounded by the magnetic collection core 25, thereby forming such a structure that the leakage magnetic flux hardly enters the current sensor. Thus, deterioration in accuracy of the current sensors can be further suppressed.

Second Embodiment

Figure 7:
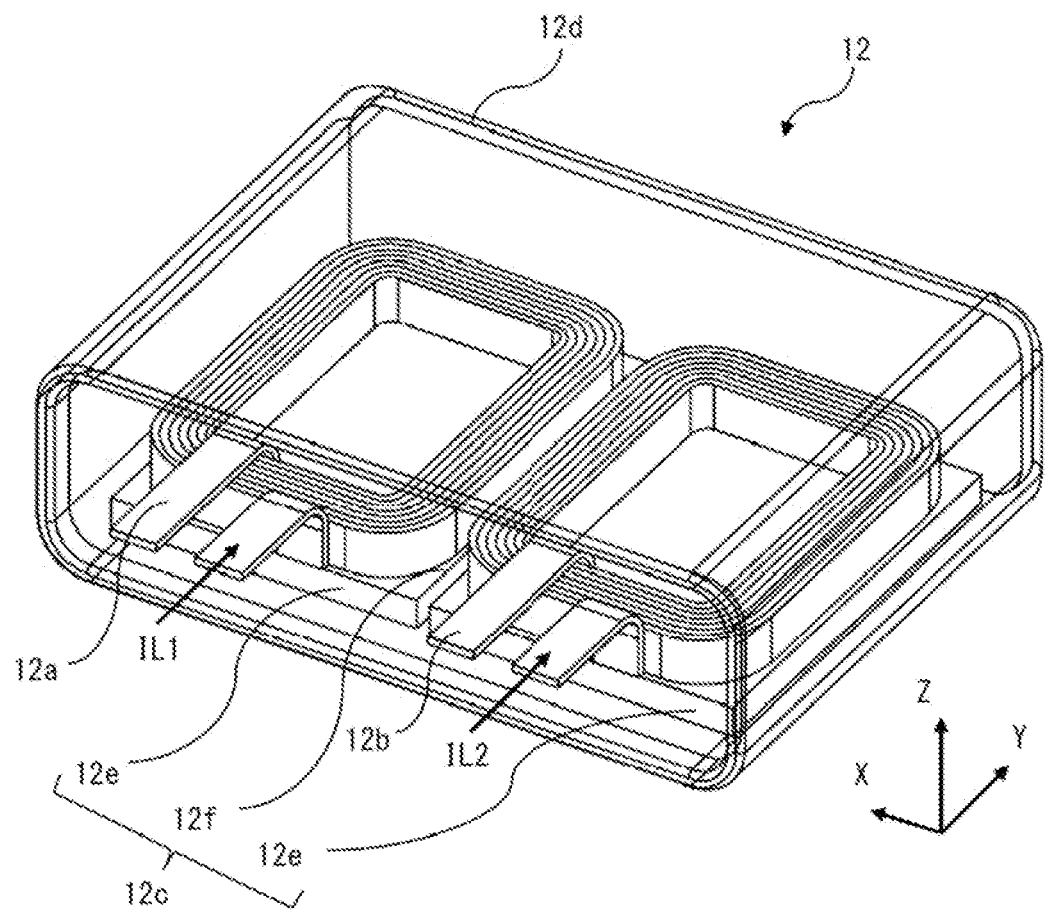
FIG. 7 is a perspective view showing a magnetically-coupled reactor of a power conversion device according to the second embodiment of the present disclosure.
Figure 8:
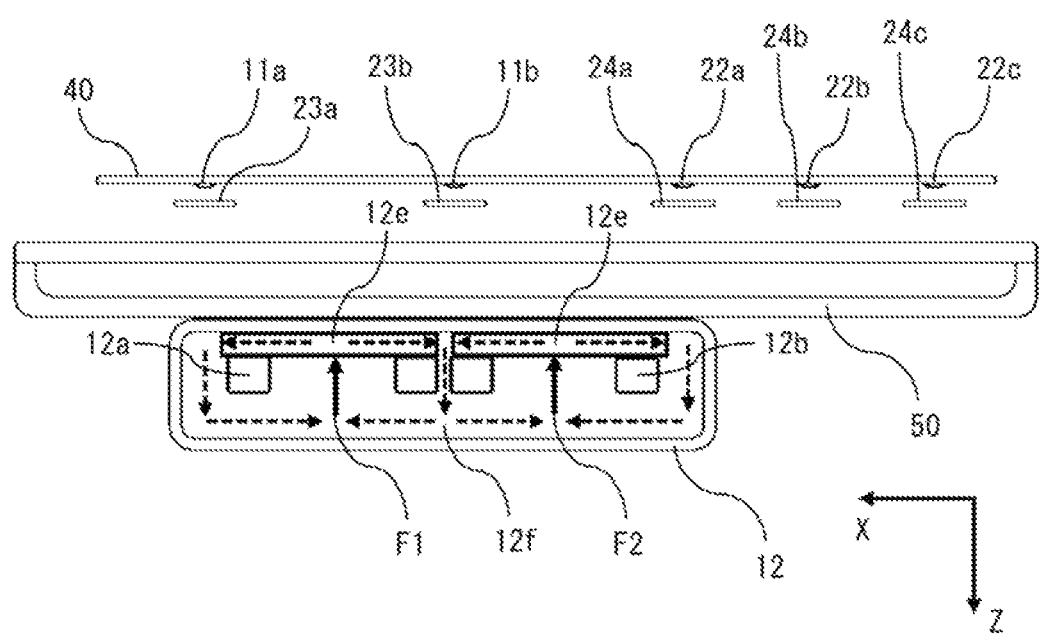
FIG. 8 is a sectional view showing a specific part of the power conversion device according to the second embodiment.

A power conversion device 100 according to the second embodiment of the present disclosure will be described. FIG. 7 is a perspective view showing the magnetically-coupled reactor 12 of the power conversion device 100 according to the second embodiment, and FIG. 8 is a sectional view showing a specific part of the power conversion device 100. In FIG. 7, the inside of the magnetically-coupled reactor 12 is shown transparently. The power conversion device 100 according to the second embodiment is different from the first embodiment in the core 12c of the magnetically-coupled reactor 12.

The core 12c of the magnetically-coupled reactor 12 includes high-permeability cores 12e and a low-permeability core 12f having lower permeability than the high-permeability cores 12e. The high-permeability cores 12e are provided on the cooler 50 side of the first winding 12a and the second winding 12b. In the present embodiment, each high-permeability core 12e is a dust core and has first permeability $\mu_1$. The high-permeability core 12e is formed by compressing a binder and soft magnetic alloy powder having been subjected to insulation treatment. The high-permeability core 12e is not limited thereto, and may be manufactured by another method.

In the present embodiment, the low-permeability core 12f is a composite magnetic body containing soft magnetic powder and a binder. The low-permeability core 12f is a cast core and has second permeability $\mu_2$. The low-permeability core 12f is a composite magnetic body formed such that soft magnetic alloy powder of iron-based alloy, ferrite, or the like is distributed inside a cured binder. As with the core 12c described in the first embodiment, the low-permeability core 12f in the present embodiment is formed by curing a slurry containing the soft magnetic alloy powder, the binder, and the like. The low-permeability core 12f is not limited thereto, and may be manufactured by another method. At least parts of the first winding 12a and the second winding 12b are embedded in the low-permeability core 12f.

The core 12c described in the first embodiment contains a binder and the like in addition to soft magnetic powder which is powder of a magnetic material, and therefore the permeability of the core alone is lower than the permeability of a conventional dust core. Therefore, there is a possibility that a part of a magnetic flux generated due to DC current leaks into the outside air. If such a leakage magnetic flux occurs, accuracy of the current sensors might be deteriorated. Accordingly, in the magnetically-coupled reactor 12 of the power conversion device 100 in the second embodiment, the core 12c is configured by a combination of the high-permeability cores 12e and the low-permeability core 12f. With this configuration, leakage of a magnetic flux to the cooler 50 side is further suppressed, whereby deterioration in accuracy of the current sensors can be further suppressed. In addition, combining the high-permeability cores 12e can increase the inductance of the magnetically-coupled reactor 12, whereby the power conversion device 100 can be downsized. The details will be described below.

Flow of a magnetic flux generated in the magnetically-coupled reactor 12 will be described with reference to FIG. 8. As shown in FIG. 1 and FIG. 7, currents IL1, IL2 flow through the first winding 12a and the second winding 12b of the magnetically-coupled reactor 12. Magnetic fluxes generated at this time are indicated by a plurality of arrows F1, F2 in FIG. 8. The generated magnetic fluxes F1, F2 first flow toward the high-permeability cores 12e. Each magnetic flux F1, F2 is branched in the high-permeability core 12e, passes through the high-permeability core 12e, and flows toward the low-permeability core 12f. Then, the magnetic fluxes F1, F2 pass inside the low-permeability core 12f and return into the first winding 12a and the second winding 12b. The routes of the magnetic fluxes F1, F2 are routes passing inside the high-permeability cores 12e and the low-permeability core 12f provided on the outer side of the windings. The high-permeability cores 12e are provided on the cooler 50 side toward which the magnetic fluxes F1, F2 first flow. Therefore, even if the magnetically-coupled reactor 12 is used as a reactor, the magnetic flux generated from the magnetically-coupled reactor 12 is inhibited from entering the current sensors, whereby deterioration in accuracy of the current sensors can be suppressed.

Even if a leakage magnetic flux is generated from the low-permeability core 12f to the outer side of the case 12d, the leakage magnetic flux does not reach the current sensor side, because the current sensors are provided on the side opposite to the magnetically-coupled reactor 12 with the cooler 50 and the high-permeability core 12e therebetween. Since the leakage magnetic flux does not reach the current sensors, deterioration in accuracy of the current sensors due to the leakage magnetic flux can be suppressed.

As described above, in the power conversion device 100 according to the second embodiment, the core 12c of the magnetically-coupled reactor 12 has the high-permeability cores 12e and the low-permeability core 12f having lower permeability than the high-permeability cores 12e, and the high-permeability cores 12e are provided on the cooler 50 side of the first winding 12a and the second winding 12b. Therefore, the magnetic flux generated from the magnetically-coupled reactor 12 can be further inhibited from entering the current sensors, whereby deterioration in accuracy of the current sensors can be further suppressed. In a case where each high-permeability core 12e is a dust core, the low-permeability core 12f is a composite magnetic body containing soft magnetic powder and a binder, and at least parts of the first winding 12a and the second winding 12b are embedded in the low-permeability core 12f, the magnetic flux generated from the magnetically-coupled reactor 12 can be further inhibited from entering the current sensors, because the dust core is a material having particularly high permeability. In addition, since the dust core efficiently transfers heat generated at the first winding 12a and the second winding 12b to the cooler 50, the power conversion device 100 can be downsized also in terms of thermal efficiency. In addition, forming the core 12c with the high-permeability cores 12e combined can increase the inductance of the magnetically-coupled reactor 12, whereby the power conversion device 100 can be downsized.

Third Embodiment

Figure 9:
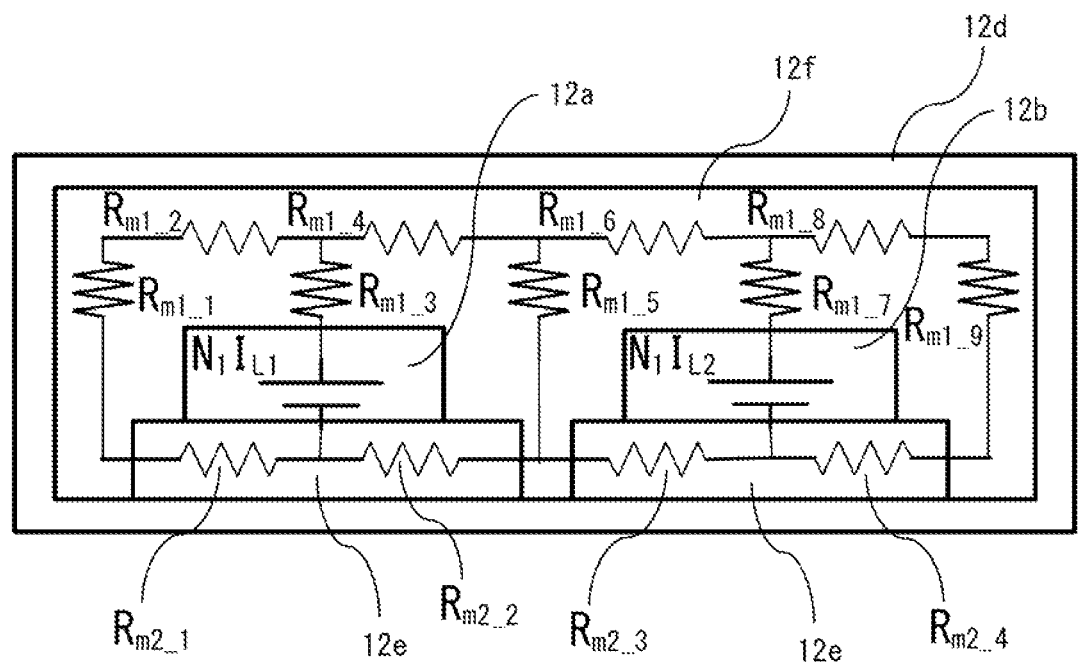
FIG. 9 is a diagram showing a magnetic circuit model of a magnetically-coupled reactor of a power conversion device according to the third embodiment of the present disclosure.
Figure 10:
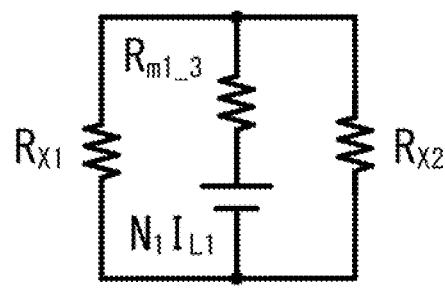
FIG. 10 is a diagram showing an equivalent circuit on a first winding side of the magnetic circuit model shown in FIG. 9.
Figure 11:
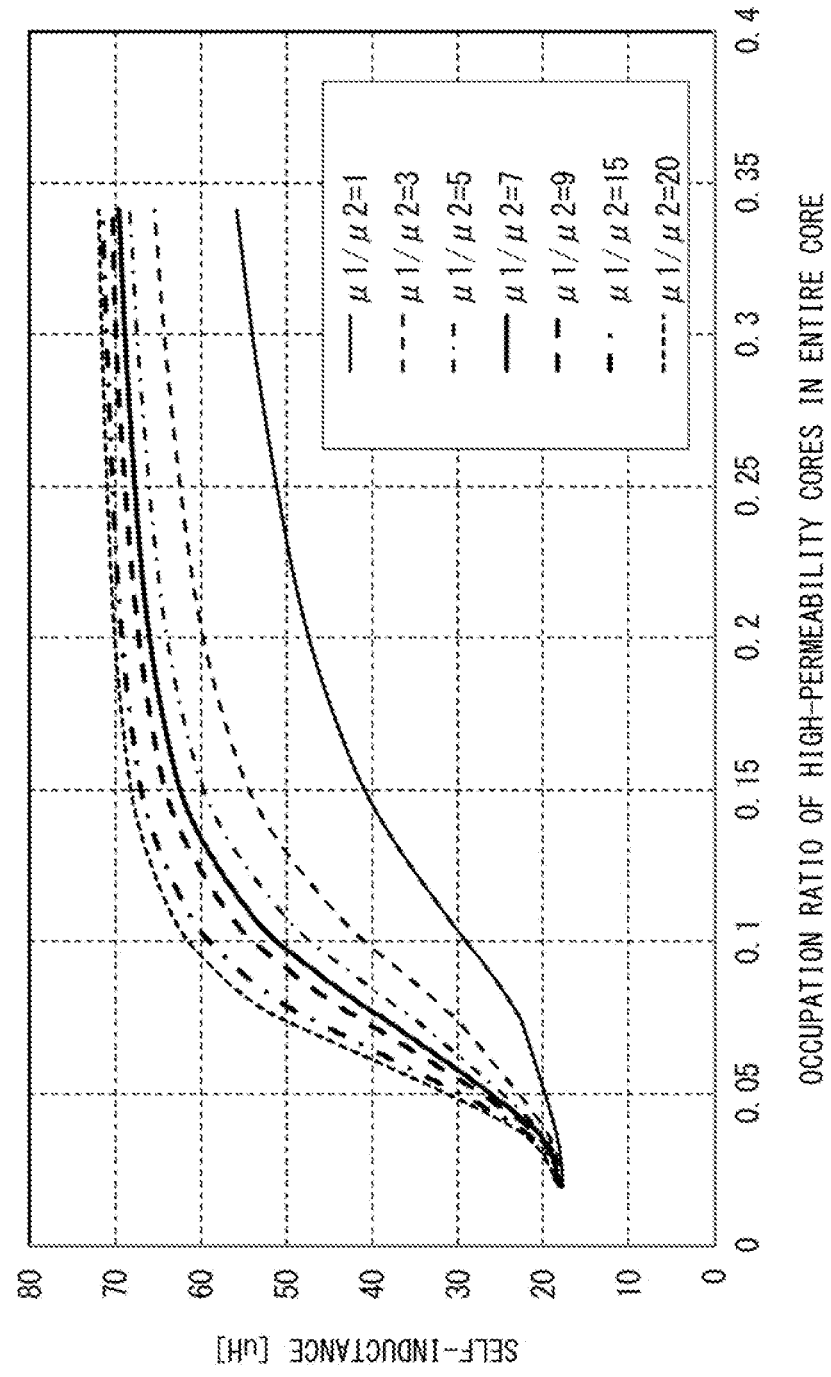
FIG. 11 shows an analysis result of an inductance value on the first winding side.
Figure 12:
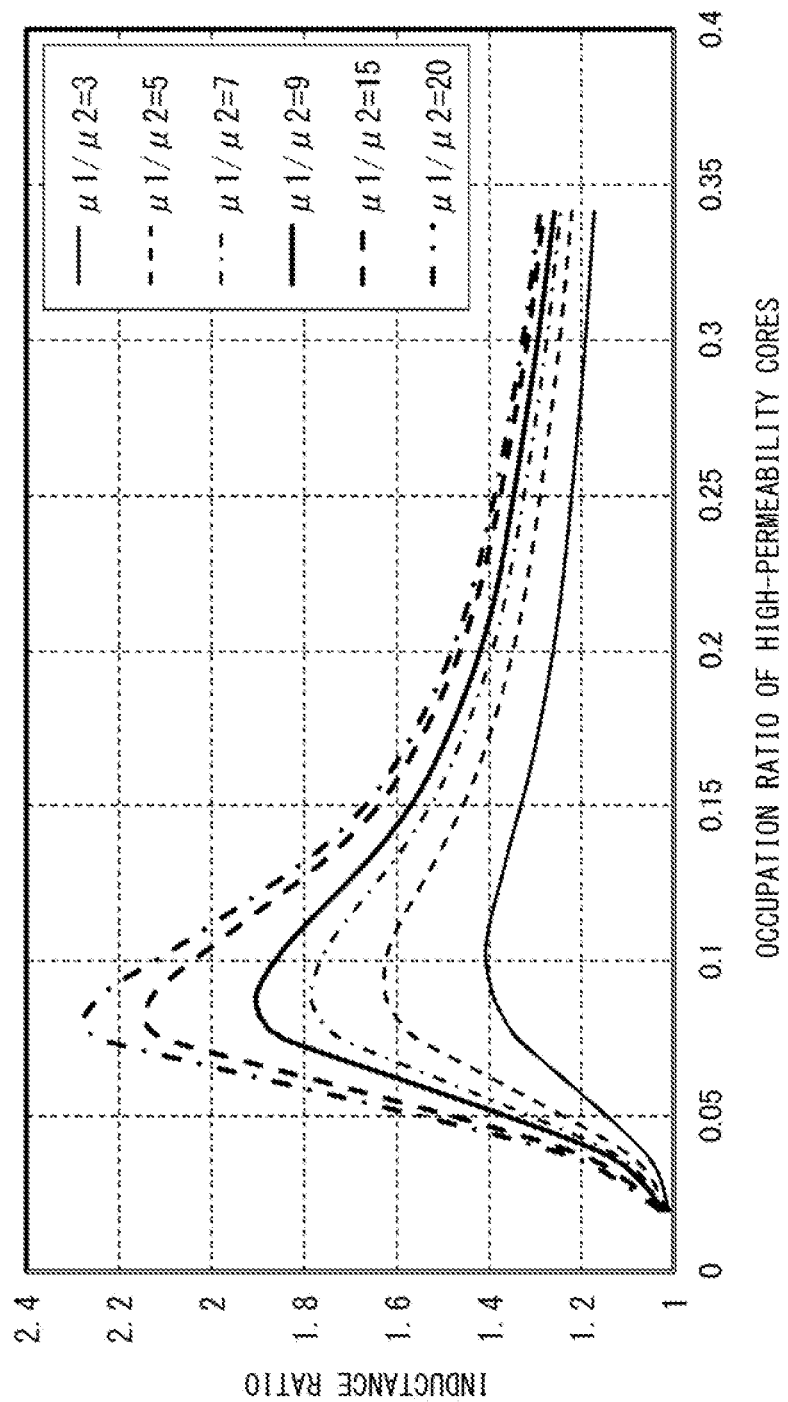
FIG. 12 shows an analysis result of the inductance value on the first winding side.

A power conversion device 100 according to the third embodiment of the present disclosure will be described. FIG. 9 is a diagram showing a magnetic circuit model of the magnetically-coupled reactor 12 of the power conversion device 100 according to the third embodiment, FIG. 10 is a diagram showing an equivalent circuit as seen from the first winding 12a side of the magnetic circuit model shown in FIG. 9, and FIG. 11 and FIG. 12 show analysis results of a self-inductance value on the first winding 12a side. The power conversion device 100 according to the third embodiment is configured in a reduced size by optimizing the core 12c of the magnetically-coupled reactor 12 described in the second embodiment.

FIG. 9 shows a magnetic circuit model of the magnetically-coupled reactor 12 shown in FIG. 7. In the magnetically-coupled reactor 12, the number of turns of the first winding 12a is denoted by $N_1$ and the number of turns of the second winding 12b is denoted by $N_2$. In addition, magnetomotive forces corresponding to the currents $I_{L1}$, $I_{L2}$ flowing through the respective windings are denoted by $N_1 I_{L1}$, $N_2 I_{L2}$. In addition, magnetic resistances of the low-permeability core 12f are denoted by $R_{m1\_1}$ to $R_{m1\_9}$, and magnetic resistances of the high-permeability cores 12e are denoted by $R_{m2\_1}$ to $R_{m2\_4}$. Where the permeability, the sectional area, and the magnetic path length of the core in total are respectively denoted by $\mu$, A, and l, a magnetic resistance $R_m$ is represented by Expression (1).

[Mathematical 1]

$$R_m = \frac{l}{\mu A} \quad (1)$$

The permeability $\mu$ is a value obtained by multiplying a vacuum permeability $\mu_0$ by a relative permeability $\mu_r$.

Here, the self-inductance as seen from the first winding 12a side in FIG. 9 is calculated on the basis of a magnetic circuit. FIG. 10 is an equivalent circuit diagram as seen from the first winding 12a side in FIG. 9. Here, a magnetic resistance $R_{X1}$ is a combined resistance of $R_{m1\_1}$, $R_{m1\_2}$, and $R_{m2\_1}$. A magnetic resistance $R_{X2}$ is a combined resistance of a magnetic circuit in which the magnetic flux generated from the first winding 12a passes through $R_{m1\_4}$ and is branched, and then merged and returned through $R_{m2\_2}$. That is, the magnetic resistance $R_{X2}$ is a combined resistance of the magnetic resistances to $R_{m1\_4}$ to $R_{m1\_9}$ and $R_{m2\_2}$ to $R_{m2\_4}$. Therefore, a magnetic resistance $R_{m0}$ of the entire circuit is represented by Expression (2).

[Mathematical 2]

$$R_{m0} = R_{m1\_3} \frac{1}{\frac{1}{R_{x1}} + \frac{1}{R_{x2}}} \quad (2)$$

From the Ohm's law in the magnetic circuit, where a magnetic flux generated by the magnetomotive force $N_1 I_{L1}$ is denoted by $\varphi_1$, the magnetomotive force $N_1 I_{L1}$ is represented by Expression (3).

[Mathematical 3]

$$N_1 I_{L1} = \phi_1 \times \frac{R_{m1\_3} R_{x1} + R_{m1\_3} R_{x2} + R_{x1} R_{x2}}{R_{x1} + R_{x2}} \quad (3)$$

The self-inductance $L_1$ is inversely proportional to the magnetic resistance, and is proportional to the square of the number $N_1$ of turns of the first winding 12a. Therefore, the self-inductance $L_1$ is represented by Expression (4).

[Mathematical 4]

$$L_1 = \frac{N_1^2}{R_{m0}} \quad (4)$$

FIG. 11 is a graph showing the self-inductance value with respect to change in the occupation ratio of the high-permeability cores 12e in the entire core 12c, on the basis of the above expression, while change in the ratio of the first permeability $\mu_1$ of the high-permeability cores 12e relative to the second permeability $\mu_2$ of the low-permeability core 12f is used as a parameter. It is noted that, in FIG. 11, the number of turns of each winding is 14, the relative permeability of the low-permeability core 12f is 10 to 12 in a range of 0 A to 100 A, and the entire volume of the magnetically-coupled reactor 12 is about 500 cc, and under this condition, the self-inductance value is analyzed while the relative permeability of the high-permeability cores 12e and the height of the high-permeability cores 12e on the winding lower surface side are changed.

From the analysis result in FIG. 11, it is found that the self-inductance value greatly increases when the first permeability $\mu_1$ of the high-permeability cores 12e is equal to or greater than three times the second permeability $\mu_2$ of the low-permeability core 12f. Meanwhile, a core having high permeability has such characteristics as to be readily saturated. Therefore, considering the self-inductance of the entire magnetically-coupled reactor, it is required that the magnetically-coupled reactor is designed so as not to be saturated at the maximum current value. In FIG. 11, the self-inductance value does not greatly differ between a case of $\mu_1/\mu_2=15$ and a case of $\mu_1/\mu_2=20$. Therefore, in the magnetically-coupled reactor, it is desirable that the permeability ratio ($\mu_1/\mu_2$) between the high-permeability core 12e and the low-permeability core 12f satisfies $3 \leq \mu_1/\mu_2 \leq 15$.

FIG. 12 is a graph showing comparison of the inductance value of each core, using, as a reference, the inductance value ($\mu_1/\mu_2=1$) of the low-permeability core 12f alone which is a cast core, on the basis of the analysis result in FIG. 11. The vertical axis in FIG. 12 indicates a value (ratio) obtained by dividing the inductance value of each core by the inductance value of the low-permeability core 12f alone. As shown in FIG. 12, the inductance value of each core has a peak when the occupation ratio of the high-permeability cores 12e is about 10%. From the above, it is desirable that the occupation ratio of the high-permeability cores 12e is 7.5 to 25%. The reason why the inductance value does not increase proportionally even when the occupation ratio of the high-permeability cores 12e increases as shown in FIG. 12 is because the low-permeability core 12f is present in the magnetic flux path and thus the magnetic resistance is influenced by the low-permeability core 12f.

As described above, in the power conversion device 100 according to the third embodiment, the high-permeability cores 12e have the first permeability $\mu_1$, the low-permeability core 12f has the second permeability $\mu_2$, and the permeability ratio between the first permeability $\mu_1$ and the second permeability $\mu_2$ satisfies $3 \leq \mu_1/\mu_2 \leq 15$. Therefore, while using a configuration in which size increase of the magnetically-coupled reactor 12 is suppressed and deterioration in accuracy of the current sensors due to a leakage magnetic flux is suppressed, it is possible to increase the self-inductance of the magnetically-coupled reactor 12 so that the core 12c is less likely to be saturated. In addition, in a case where the occupation ratio of the high-permeability cores 12e in the core 12c is in a range of 7.5 to 25%, the occupation ratio of the high-permeability cores 12e is optimized, whereby size increase of the magnetically-coupled reactor 12 can be suppressed.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS

1 DC input power supply
2 input power smoothing capacitor
3 link capacitor
4 motor
10 DC-DC boost converter circuit
10a positive-side output terminal
10b negative-side output terminal
11a current sensor
11b current sensor
12 magnetically-coupled reactor
12a first winding
12b second winding
12c core
12d case
12e high-permeability core
12f low-permeability core
13a first semiconductor switching element
13b second semiconductor switching element
13c third semiconductor switching element
13d fourth semiconductor switching element
20 inverter circuit
21a first semiconductor switching element
21b second semiconductor switching element
21c third semiconductor switching element
21d fourth semiconductor switching element
21e fifth semiconductor switching element
21f sixth semiconductor switching element
22a current sensor
23a bus bar
24a bus bar
25 magnetic collection core
30 control unit
31 signal line
32 control line
33 control line
40 control board
50 cooler
90 magnetically-coupled reactor
90a first winding
90b second winding
90c core
100 power conversion device

What is claimed is:
1. A power conversion device comprising:
a boost converter which includes a magnetically-coupled reactor and a plurality of semiconductor switching elements connected to the magnetically-coupled reactor, and boosts DC voltage supplied from an external power supply;
an inverter which converts DC power outputted from the boost converter, to AC power, and supplies the AC power to an external load;
a cooler for cooling the magnetically-coupled reactor;
a bus bar which is a conductive wiring member; and
a current sensor for detecting a magnetic flux generated around the bus bar, wherein
the plurality of semiconductor switching elements include a first semiconductor switching element and a second semiconductor switching element connected in series between positive-side and negative-side output termi- nals of the boost converter, and a third semiconductor switching element and a fourth semiconductor switching element connected in series between the positive-side and negative-side output terminals, the magnetically-coupled reactor includes
- a first winding having one end connected to a positive side of the external power supply and another end connected between the first semiconductor switching element and the second semiconductor switching element,
- a second winding having one end connected to the positive side of the external power supply and another end connected between the third semiconductor switching element and the fourth semiconductor switching element, the second winding being wound with the same number of turns as the first winding so as to be magnetically coupled with the first winding in a direction opposite thereto, and
- a core for magnetically coupling the first winding and the second winding, the core has a composite magnetic body containing soft magnetic powder and a binder, and at least parts of the first winding and the second winding are embedded in the composite magnetic body, the cooler is provided in contact with the magnetically-coupled reactor, and the current sensor is provided on a side opposite to the magnetically-coupled reactor with the cooler therebetween.

2. The power conversion device according to claim 1, wherein
the bus bar is provided between the current sensor and the cooler.

3. The power conversion device according to claim 1, wherein
the bus bar has a magnetic collection core for collecting the magnetic flux generated around the bus bar, and
the current sensor detects the magnetic flux collected by the magnetic collection core.

4. The power conversion device according to claim 1, wherein
the core includes a high-permeability core and a low-permeability core having lower permeability than the high-permeability core, and
the high-permeability core is provided on the cooler side of the first winding and the second winding.

5. The power conversion device according to claim 4, wherein
the high-permeability core is a dust core,
the low-permeability core is the composite magnetic body containing the soft magnetic powder and the binder, and
at least parts of the first winding and the second winding are embedded in the low-permeability core.

6. The power conversion device according to claim 4, wherein
the high-permeability core has first permeability $\mu_1$ and the low-permeability core has second permeability $\mu_2$, and
a permeability ratio between the first permeability and the second permeability satisfies $3 \le \mu_1/\mu_2 \le 15$.

7. The power conversion device according to claim 6, wherein
an occupation ratio of the high-permeability core in the core is in a range of 7.5 to 25%.

* * * * *